(12) United States Patent
Baek et al.

(10) Patent No.: US 11,626,575 B2
(45) Date of Patent: Apr. 11, 2023

(54) DISPLAY DEVICE INCLUDING A BASE LAYER HAVING A BASE HOLE, AND METHOD OF MANUFACTURING THE SAME

(71) Applicant: Samsung Display Co., Ltd., Yongin-si (KR)

(72) Inventors: Gyung Min Baek, Yongin-si (KR); Hyun Ah Sung, Yongin-si (KR); Hyun Eok Shin, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 95 days.

(21) Appl. No.: 17/172,742

(22) Filed: Feb. 10, 2021

(65) Prior Publication Data
US 2022/0037620 A1 Feb. 3, 2022

(30) Foreign Application Priority Data
Jul. 31, 2020 (KR) .................. 10-2020-0096338

(51) Int. Cl.
*H01L 51/52* (2006.01)
*H01L 27/32* (2006.01)
*H01L 51/56* (2006.01)

(52) U.S. Cl.
CPC ........ *H01L 51/5253* (2013.01); *H01L 27/322* (2013.01); *H01L 27/3272* (2013.01); *H01L 27/3276* (2013.01); *H01L 51/56* (2013.01); H01L 2251/303 (2013.01)

(58) Field of Classification Search
CPC .............. H01L 27/322; H01L 27/3272; H01L 27/3276; H01L 51/5253; H01L 51/56; H01L 2227/323; H01L 2251/303
USPC .......................................................... 257/40
See application file for complete search history.

(56) References Cited

U.S. PATENT DOCUMENTS

| 2014/0375916 | A1* | 12/2014 | Chen ..................... G02F 1/1345 349/33 |
| 2018/0247994 | A1* | 8/2018 | Seo ...................... H01L 27/1218 |
| 2019/0131377 | A1* | 5/2019 | Kwon ..................... H01L 51/56 |
| 2020/0133614 | A1 | 4/2020 | Oh et al. |

FOREIGN PATENT DOCUMENTS

KR 10-2020-0047862 A 5/2020

* cited by examiner

*Primary Examiner* — Matthew E. Gordon
(74) *Attorney, Agent, or Firm* — Lewis Roca Rothgerber Christie LLP

(57) ABSTRACT

A display device according to an embodiment may include a base layer including a first surface and a second surface, a pixel circuit layer including a first line on the first surface, a display element layer on the pixel circuit layer and including a display element, a thin film encapsulation layer on the display element layer, a first protective layer on the thin film encapsulation layer, and a second line on the second surface to correspond to the first line. The first protective layer may include a transparent insulating material.

21 Claims, 11 Drawing Sheets

FIG. 1
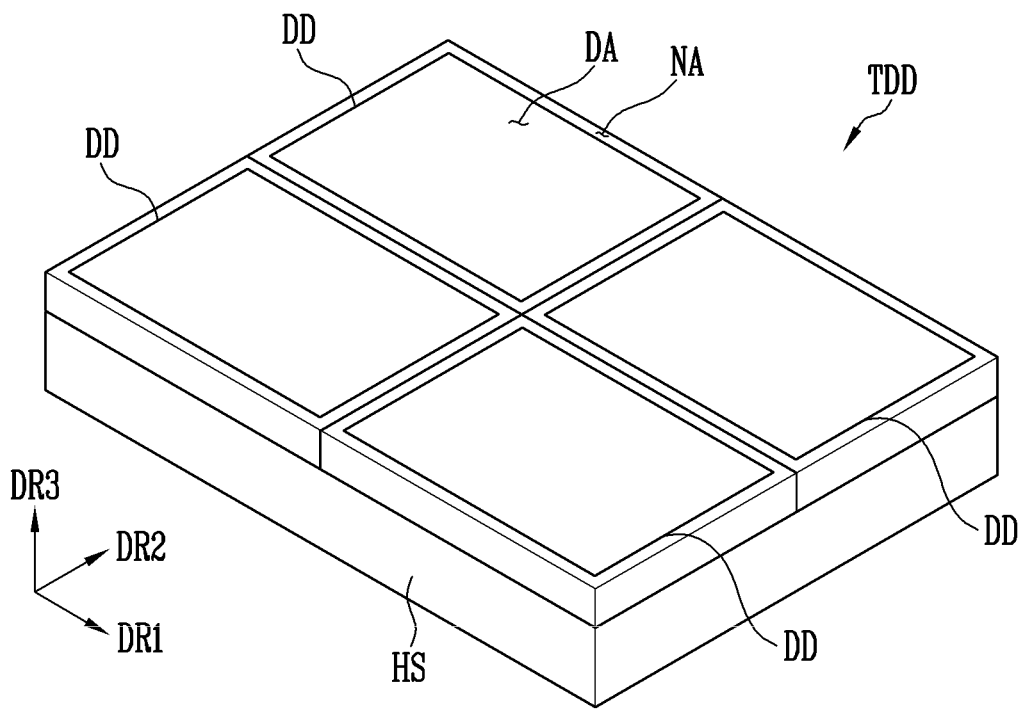
FIG. 2
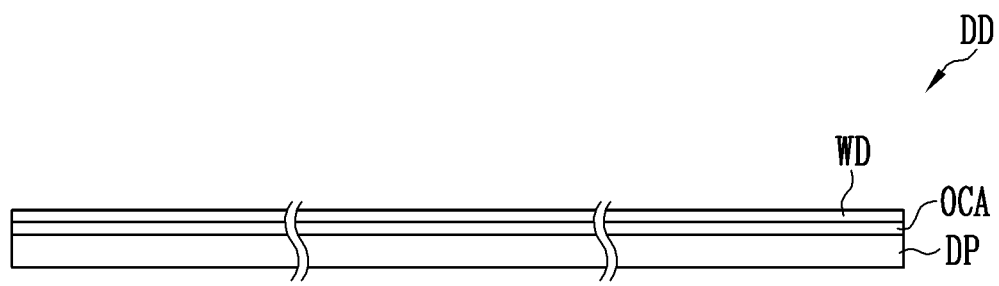
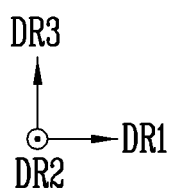

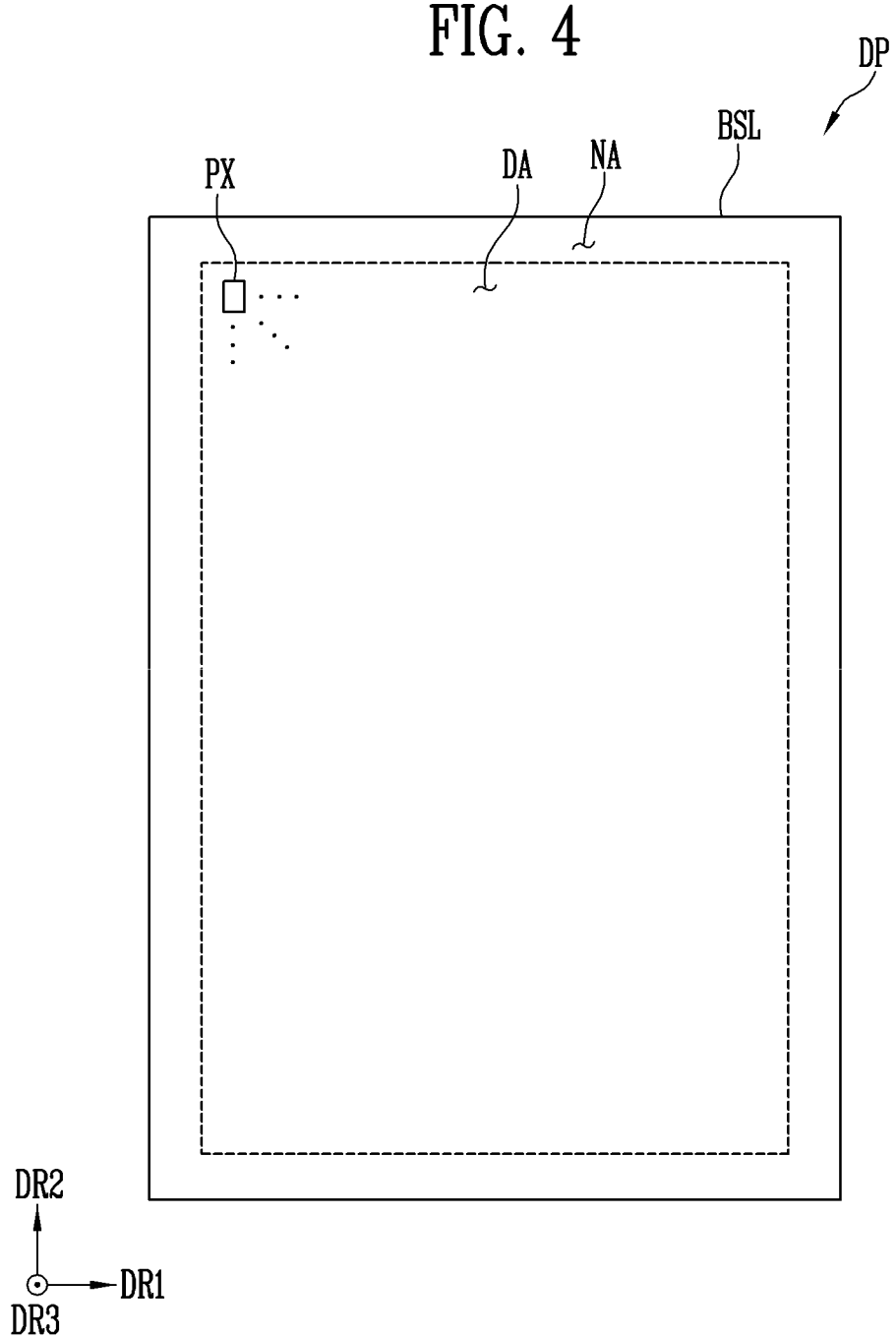

FIG. 7
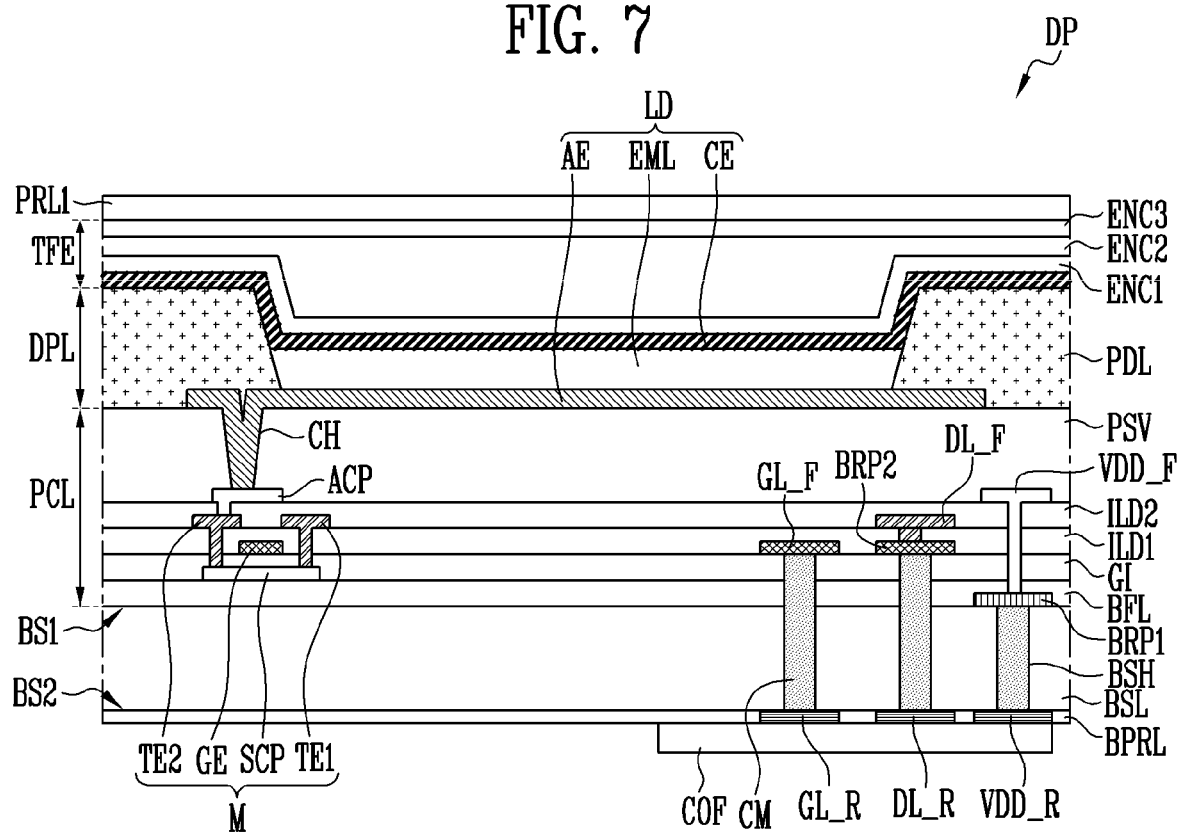
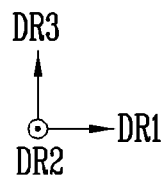

FIG. 8F
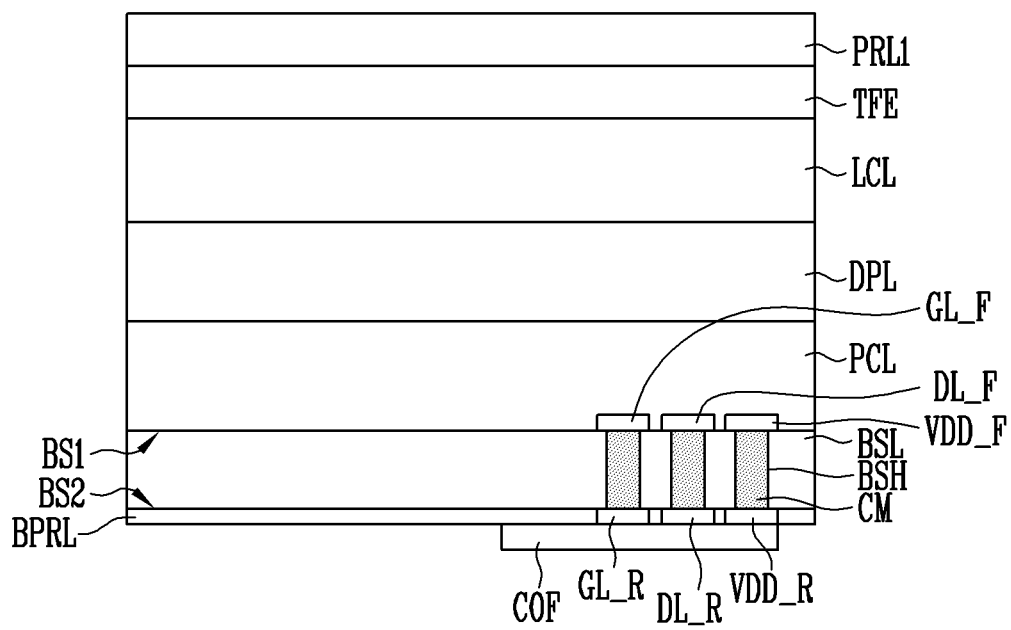
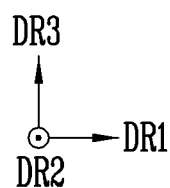
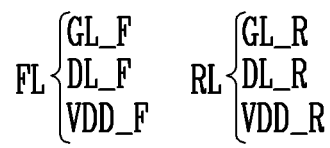

DISPLAY DEVICE INCLUDING A BASE LAYER HAVING A BASE HOLE, AND METHOD OF MANUFACTURING THE SAME

CROSS-REFERENCE TO RELATED APPLICATION

This application claims priority to and the benefit of Korean Patent Application No. 10-2020-0096338, filed on Jul. 31, 2020, the entire content of which is hereby incorporated by reference.

BACKGROUND

1. Field

The disclosure relates to a pixel and a display device and to a method of manufacturing the same.

2. Description of the Related Art

As interest in an information display is increasing and a demand for utilizing a portable information media is increasing, a demand for and a commercialization of a display device (that can display information and/or be portable) are being focused.

SUMMARY

An aspect of the disclosure is directed towards a protective layer for protecting a display panel.

A display device according to an embodiment of the disclosure includes a base layer including a first surface and a second surface, a pixel circuit layer including a first line on the first surface, a display element layer positioned on the pixel circuit layer and including a display element, a thin film encapsulation layer positioned on the display element layer, a first protective layer positioned on the thin film encapsulation layer, and a second line positioned on the second surface to correspond to the first line. The first protective layer includes (e.g., is) a transparent insulating material.

The first protective layer may include (e.g., be) molybdenum oxide ($MoO_3$) or silicon oxide ($SiO_x$).

The display element layer may include a light emitting element, and the light emitting element may include an organic light emitting diode or an inorganic light emitting diode.

The display device may further include a light conversion layer positioned between the display element layer and the thin film encapsulation layer.

The light conversion layer may include a color conversion layer on the light emitting element and including color conversion particles that converts first color light emitted from the light emitting element into second color light, and a color filter positioned on the display element layer or the color conversion layer.

The pixel circuit layer may include a plurality of insulating layers and at least one transistor, the at least one transistor may include a first semiconductor layer positioned on the first surface of the base layer and including a channel region, a source region, and a drain region, a gate electrode positioned to overlap the channel region, and a source electrode and a drain electrode respectively coupled (e.g., connected) to the source region and the drain region, and the plurality of insulating layers may include a gate insulating layer positioned between the first semiconductor layer and the gate electrode, and a first interlayer insulating layer positioned on the gate electrode.

The first line may include at least one selected from a first gate line positioned on the same layer as the gate electrode and a first data line positioned on the same layer as the source electrode or the drain electrode.

The second line may include at least one selected from a second gate line electrically coupled (e.g., connected) to the first gate line through a base hole passing through the base layer, and a second data line electrically coupled (e.g., connected) to the first data line through the base hole.

The base hole may be filled with a conductive material, and the first line and the second line may be physically and electrically coupled (e.g., connected) to each other through the conductive material.

The display device may further include a lower protective layer entirely on the second surface including the second line and exposing a portion of the second line in a predetermined or set area (e.g., a set area of the lower protective layer).

The display device may further include a connection film contacting the portion of the second line exposed by the lower protective layer.

A method of manufacturing a display device according to an embodiment includes preparing a base layer in which a base hole area is defined, and irradiating a laser to the base hole area, filling a conductive material in the base hole processed (e.g., irradiated) with the laser, coupling (e.g., attaching) a first surface protective film to a first surface of the base layer, and coupling (e.g., attaching) a second surface protective film to a second surface of the base layer, removing the first surface protective film, and sequentially forming a circuit element layer including a first line, a display element layer, and a thin film encapsulation layer on the first surface of the base layer, forming a first protective layer and a second protective layer on the thin film encapsulation layer, rotating the base layer up and down to remove the second surface protective film, and forming a second line on the second surface of the base layer, and rotating the base layer up and down and removing the second protective layer.

The first protective layer may be formed of an insulating material including (e.g., being) molybdenum oxide ($MoO_3$) or silicon oxide ($SiO_x$).

The second protective layer may be formed of a conductive material including (e.g., being) aluminum (Al).

The second protective layer may be formed to be at a thickness of 30 Å to 100 Å.

The second line may be to overlap the first line and may be formed to be physically and electrically coupled (e.g., connected) to the first line and the conductive material.

The method may further include forming the second line and forming a lower protective layer covering the second line, and etching the lower protective layer so that a portion of the second line is exposed.

The method may further include coupling (e.g., attaching) a connection film to the exposed portion of the second line.

The method may further include forming a light emitting element including an organic light emitting diode or an inorganic light emitting diode on the display element layer.

The method may further include forming a light conversion layer between the display element layer and the thin film encapsulation layer.

According to an embodiment, a display panel may be protected from static electricity, a scratch, and the like introduced from the outside by positioning the protective layer including (e.g., being) the transparent insulating material on the thin film encapsulation layer of the display panel.

Aspects according to embodiments are not limited to that illustrated above, and various aspects are included in the present specification and/or will be recognized by those of ordinary skill in the art.

BRIEF DESCRIPTION OF THE DRAWINGS

The above and other features of the disclosure will become more apparent by describing in further detail embodiments thereof with reference to the accompanying drawings, in which:

FIG. 1 is a perspective view illustrating a display device according to an embodiment;

FIG. 2 is a schematic cross-sectional view of the display device according to an embodiment;

FIG. 4 is a schematic plan view of the display panel according to an embodiment;

FIG. 7 is a cross-sectional view illustrating a portion of the display panel according to another embodiment;

FIGS. 8A to 8F are cross-sectional views illustrating a method of manufacturing a display device according to an embodiment;

DETAILED DESCRIPTION

Figure 3A:
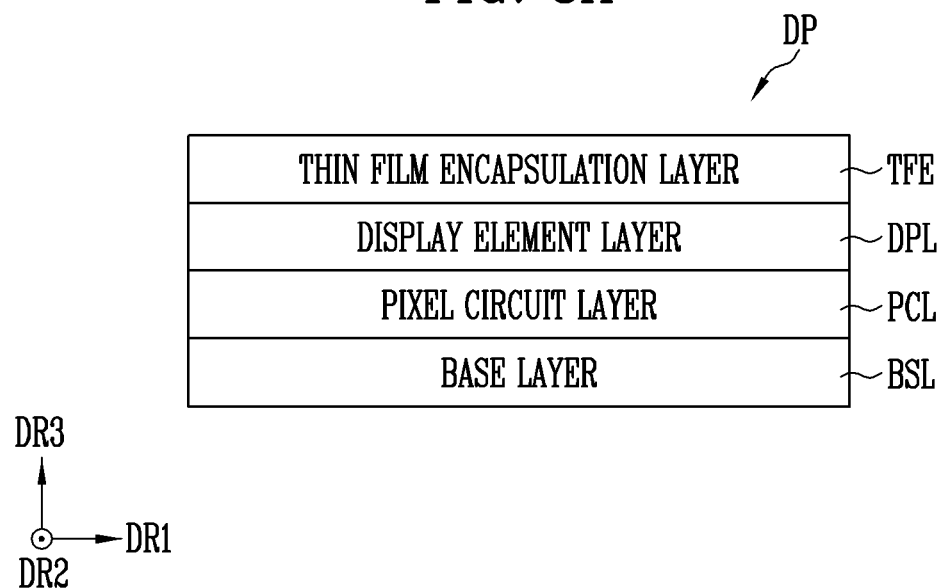
FIGS. 3A and 3B are each a cross-sectional view schematically illustrating a configuration of a display panel according to an embodiment.

The disclosure may be variously and suitably modified and may have various suitable forms. Therefore, specific embodiments will be illustrated in the drawings and will be described in more detail in the specification. However, it should be understood that the disclosure is not intended to be limited to the disclosed specific forms, and the disclosure includes all suitable modifications, equivalents, and substitutions within the spirit and technical scope of the disclosure. As used herein, the use of the term "may," when describing embodiments of the present disclosure, refers to "one or more embodiments of the present disclosure." As used herein, the term "and/or" includes any and all combinations of one or more of the associated listed items. As used herein, the terms "substantially," "about," "approximately," and similar terms are used as terms of approximation and not as terms of degree, and are intended to account for the inherent deviations in measured or calculated values that would be recognized by those of ordinary skill in the art.

Terms such as "first," "second," and the like may be used to describe various components, but the components should not be limited by these terms. These terms are used only for the purpose of distinguishing one component from another component. For example, without departing from the scope of the disclosure, a first component may be referred to as a second component, and similarly, a second component may also be referred to as a first component. The singular expressions include plural expressions unless the context clearly indicates otherwise.

It should be understood that in the present application, a term such as "include," "have," and the like is used to specify that there is a feature, a number, a step, an operation, a component, a part, or a combination thereof described in the specification, but does not exclude a possibility of the presence or addition of one or more other features, numbers, steps, operations, components, parts, or combinations thereof. In addition, a case where a portion of a layer, a film, an area, a plate, or the like is referred to as being "on" another portion, it includes not only a case where the portion is "directly on" the other portion, but also a case where there is further another portion(s) between the portion and the other portion. In addition, in the present specification, when a portion of a layer, a film, an area, a plate, or the like is formed on another portion, a forming direction is not limited to an upper direction but includes forming the portion on a side surface or in a lower direction. When a portion of a layer, a film, an area, a plate, or the like is formed "under" another portion, this includes not only a case where the portion is "directly beneath" the other portion but also a case where there is further another portion(s) between the portion and the other portion.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Hereinafter, a display device according to an embodiment of the disclosure is described with reference to the drawings related to the embodiments of the disclosure.

Figure 3B:
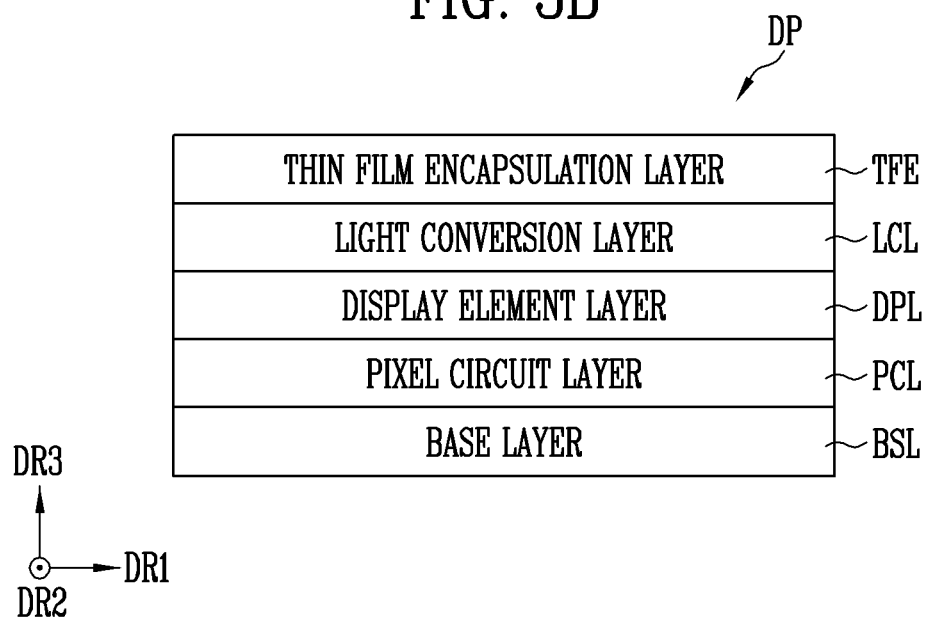

FIG. 1 is a perspective view illustrating a display device according to an embodiment, FIG. 2 is a schematic cross-sectional view of the display device according to an embodiment, FIGS. 3A and 3B are each a cross-sectional view schematically illustrating a configuration of a display panel according to an embodiment, and FIG. 4 is a schematic plan view of the display panel according to an embodiment.

Referring to FIG. 1, the display device according to an embodiment may be a multi-screen display device including a plurality of display devices.

The multi-screen display device TDD (also referred to as a "tiled display) includes a plurality of display devices DD arranged in a matrix form along a first direction DR1 and a second direction DR2, and a housing HS. The plurality of display devices DD may display an individual image or may divide and display one image. For example, the display devices DD may collectively display one integral image, or the display devices DD may each display an image independent of the images displayed by one or more of the other display devices DD. The plurality of display devices DD may include display panels of the same type (e.g., kind), structure, size, or method, but are not limited thereto.

The housing HS physically couples the display devices DD so that the plurality of display devices DD may form one multi-screen display device TDD. The housing HS may support the display devices DD under the display devices DD, and may have a fastening member, a groove structure, and the like for stably fixing the display devices DD.

Referring to one display device DD among the plurality of display devices DD, the display device DD includes a display area DA and a non-display area NA. The display area DA is an area that is to display an image, and the non-display area NA is an area other than the display area DA and does not display an image. The non-display area NA may be a bezel area surrounding (e.g., partially or entirely surrounding) the display area DA.

The display area DA may be positioned on one surface of the display device DD. For example, the display area DA may be positioned on a front surface (e.g., upper surface) of the display device DD, and may be additionally positioned on a side surface and a rear surface of the display device DD. For example, the display area DA may be positioned on one or more of the surfaces of the display device DD.

The non-display area NA may be positioned around the display area DA, and may selectively include lines, pads, driving circuits, and/or the like coupled (e.g., connected) to pixels PX of the display area DA illustrated in FIG. 4.

An image displayed on the screen of the multi-screen display device TDD may be disconnected due to the non-display area NA, for example, a seam area positioned in a boundary area between the display devices DD. For example, when a width (or area) of the non-display area NA is relatively large, a sense of disconnection of the image may be deepened in the boundary area between the display devices DD. For example, a boundary (e.g., the non-display area NA) between adjacent display devices DD of the multi-screen display device TDD may be visually recognizable when the adjacent display devices DD respectively display images.

On the other hand, when the width (or area) of the non-display area NA is reduced, a size of the display area DA may be increased without increasing a size of the display device DD. Accordingly, a larger display area DA may be provided. In addition, when the non-display area NA is reduced, when implementing the multi-screen display device TDD utilizing a plurality of display devices DD, visual recognition of a boundary between the display devices DD may be minimized or reduced, and a more natural (e.g., seamless) screen may be configured. A structure according to the present embodiment capable of minimizing or reducing the non-display area NA of the display device DD is described in more detail below.

The display device DD may be implemented in various suitable shapes. In FIG. 1, the display device DD has a rectangular plate shape, but the disclosure is not limited thereto, and the display device DD may have, for example, a shape such as a circle or an ellipse.

Referring to FIG. 2, one display device DD includes a display panel DP and a window WD disposed on the display panel DP.

The display panel DP may include the pixels PX of FIG. 4 for displaying an image, and may be a display panel of various suitable types (e.g., kinds) and structures. For example, the display panel DP may be a display panel capable of self-emission, such as an organic light emitting display panel (OLED panel) utilizing an organic light emitting diode as a light emitting element, a nano-scale LED display panel (nano LED panel) utilizing a nano-scale light emitting diode as a light emitting element, a quantum dot organic light emitting display panel (QD OLED panel) utilizing an organic light emitting diode and a quantum dot, and a quantum dot nano-scale LED display panel (QD nano LED panel) utilizing a nano-scale light emitting diode and a quantum dot. In some embodiments, the display panel DP may be a non-emission display panel such as a liquid crystal display panel (LCD panel), an electrophoretic display panel (EPD panel), or an electro-wetting display panel (EWD panel). When the non-emission display panel is utilized as the display panel DP, the display device DD may further include a separate light source device (for example, a backlight unit) for supplying light to the display panel DP.

The window WD is positioned on the display panel DP. The window WD may protect the display panel DP from an external impact, and may provide an input surface and/or a display surface to a user. The window WD may be implemented with various suitable materials including glass and/or plastic, and may be configured of a single layer or multiple layers.

For example, the window WD may be manufactured integrally with the display panel DP. In some embodiments, the window WD may be directly formed on a surface of the display panel DP. According to an embodiment, the window WD may be manufactured separately from the display panel DP and then may be coupled to the display panel DP through an optically transparent adhesive (or adhesive) member OCA.

In addition, a sensing device may be positioned between the display panel DP and the optically transparent adhesive member OCA. The sensing device may include a touch sensor, a fingerprint sensor, a pressure sensor, a temperature sensor, and/or the like.

Referring to FIG. 3A, the display panel DP includes a base layer BSL. The display panel DP also includes a pixel circuit layer PCL, a display element layer DPL, and a thin film encapsulation layer TFE sequentially disposed in a third direction DR3 on a surface of the base layer BSL.

The base layer BSL may be a rigid (e.g., suitably rigid) or flexible (e.g., suitably flexible) substrate. For example, when the base layer BSL is the rigid substrate, the base layer BSL may be implemented as a glass substrate, a quartz substrate, a glass ceramic substrate, a crystalline glass substrate, or the like. On the other hand, when the base layer BSL is the flexible substrate, the base layer BSL may be implemented as a polymer organic substrate including (e.g., being) polyimide, polyamide, and/or the like, a plastic substrate, or the like.

The pixel circuit layer PCL is positioned on the base layer BSL. The pixel circuit layer PCL may include circuit elements for configuring (e.g., providing) a pixel circuit of each pixel PX of FIG. 4 and various suitable lines coupled (e.g., connected) to the circuit elements. For example, the pixel circuit layer PCL may include at least one transistor, a storage capacitor, a gate line, a data line, a power line, and the like.

The display element layer DPL is positioned on the pixel circuit layer PCL. The display element layer DPL may include a light emitting element LD (see FIG. 5 or subsequent figures) configuring (e.g., to provide) a light source of each pixel PX of FIG. 4. For example, the light emitting element LD of FIG. 5 or subsequent figures may be an organic light emitting diode, an inorganic light emitting diode, or a subminiature inorganic light emitting diode having a size of nano to micro scale. However, in the disclosure, a type (e.g., kind), a structure, a shape and/or a size of the light emitting element provided in each pixel are/is not particularly limited.

The thin film encapsulation layer TFE is positioned on the display element layer DPL. The thin film encapsulation layer TFE may be an encapsulation substrate or a multilayer encapsulation film. For example, the thin film encapsulation layer TFE may have a multilayer structure in which an inorganic layer, an organic layer, and an inorganic layer are sequentially stacked. The thin film encapsulation layer TFE may protect the pixels PX of FIG. 4 by preventing or blocking external air and/or moisture from penetrating into the display element layer DPL and the pixel circuit layer PCL.

According to an embodiment, the display element layer DPL may be first positioned on the base layer BSL, and the pixel circuit layer PCL may be positioned on the display element layer DPL. For example, the base layer BSL, the display element layer DPL, and the pixel circuit layer PCL may be sequentially stacked in the third direction DR3.

In the above-described embodiment, a case where the thin film encapsulation layer TFE is positioned on the display element layer DPL is described, but the disclosure is not limited thereto. According to an embodiment, as shown in FIG. 3B, a light conversion layer LCL may be positioned between the display element layer DPL and the thin film encapsulation layer TFE.

The light conversion layer LCL is for converting light emitted from the display element layer DPL, and may include a color filter including (e.g., being) a color filter material of a predetermined or set color (e.g., a color filter material being configured to convert light generated by the display element layer DPL into light having a predetermined or set color) and a color conversion particle (for example, a quantum dot) corresponding to a predetermined or set color to convert the light generated in the display element layer DPL. For example, the light conversion layer LCL may selectively transmit light of a set wavelength band among the light generated from the display element layer DPL, and/or may convert the wavelength band of the light generated from the display element layer DPL.

In FIGS. 3A and 3B, a configuration of the display panel DP is schematically described under an assumption that the display panel DP is a light emitting display panel, but the disclosure is not limited thereto. For example, the configuration of the display panel DP may be variously and suitably changed according to a type (e.g., kind) of display device.

Referring to FIG. 4, the display panel DP may include the base layer BSL and the pixel PX positioned on the base layer BSL.

The base layer BSL may be formed of (e.g., may have or may provide) one area having an approximately rectangular shape. The number of areas provided in the base layer BSL may be different therefrom, and the shape of the base layer BSL may have a different shape according to the provided area. In some embodiments, the base layer BSL may be formed of (e.g., may have or may provide) one or more areas, and each of the one or more areas may have any suitable shape.

The base layer BSL may be formed of an insulating material such as glass and/or resin. In addition, the base layer BSL may be formed of a material having suitable flexibility so as to be bendable and/or foldable, and may have a single layer structure or a multilayer structure.

The base layer BSL may include the display area DA and the non-display area NA. The display area DA of the display panel DP may correspond to the display area DA of the display device DD, and the non-display area NA of the display panel DP may correspond to the non-display area NA of the display device DD.

In the non-display area NA, a driver for driving the pixels PX and a portion of a line coupling (e.g., connecting) the pixels PX and the driver may be provided. The non-display area NA may correspond to the bezel area of the display device DD.

The pixels PX may be provided in the display area DA of the base layer BSL. Each of the pixels PX may be a minimum unit (e.g., a base unit or fundamental unit) for displaying an image. The pixels PX may include the light emitting element LD of FIG. 5 or subsequent figures that is to emit white light and/or color light. Each of the pixels PX may emit light having any one color of red, green, and blue, but is not limited thereto, and may emit a color such as cyan, magenta, yellow, or the like. Each of the pixels PX may include the pixel circuit layer PCL provided on the base layer BSL and the display element layer DPL provided on the pixel circuit layer PCL. In the figure, the pixel PX has a rectangular shape, but the disclosure is not limited thereto and the shape of the pixel PX may be variously and suitably modified.

For convenience of description, only one pixel PX is shown in FIG. 4, but a plurality of pixels PX may be distributed and disposed in the display area DA. For example, the pixels PX may be disposed in the display area DA in a matrix, stripe, or PENTILE® arrangement structure. In some embodiments, the pixels PX may be disposed in the display area DA in an RGBG matrix structure. However, the disclosure is not limited thereto.

Hereinafter, a specific configuration of the display panel according to an embodiment is described with reference to FIGS. 5 to 7.

Figure 5:
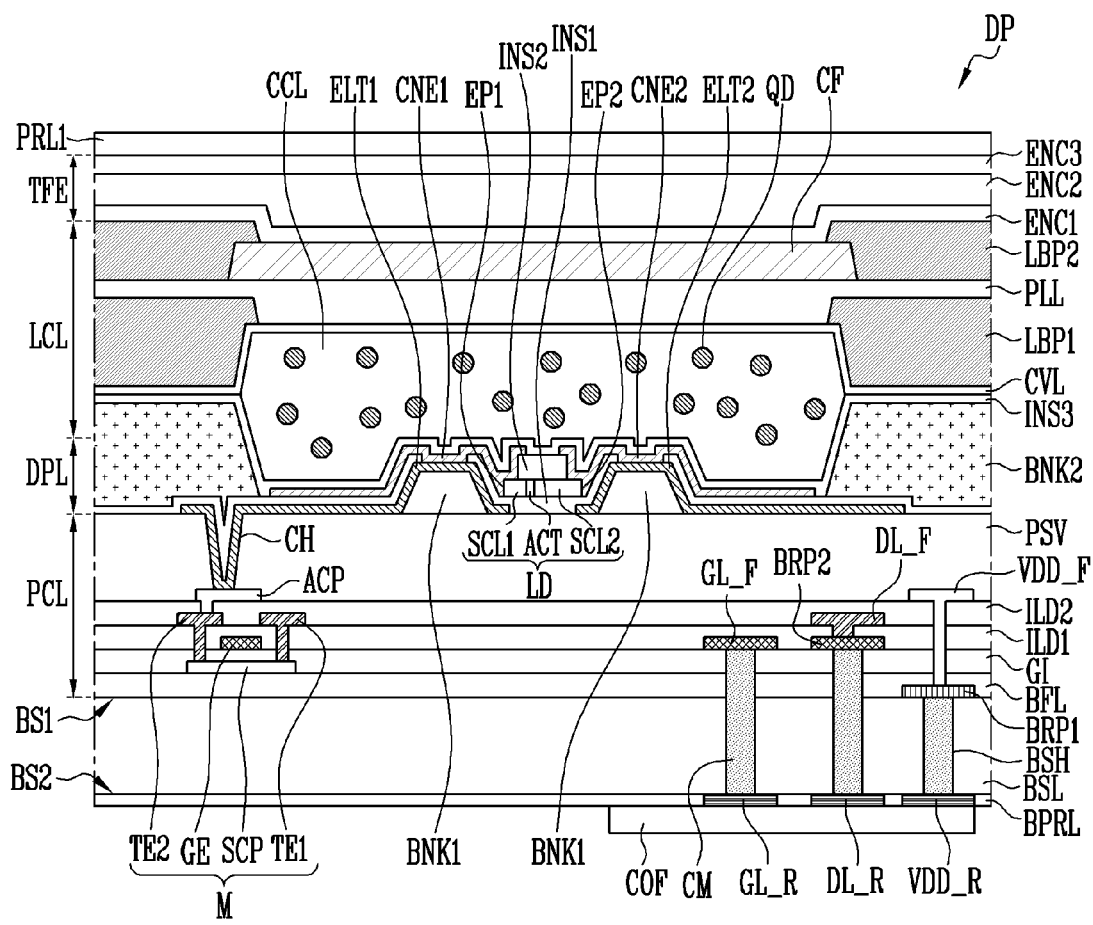
FIG. 5 is a cross-sectional view illustrating a portion of the display panel according to an embodiment.
Figure 6:
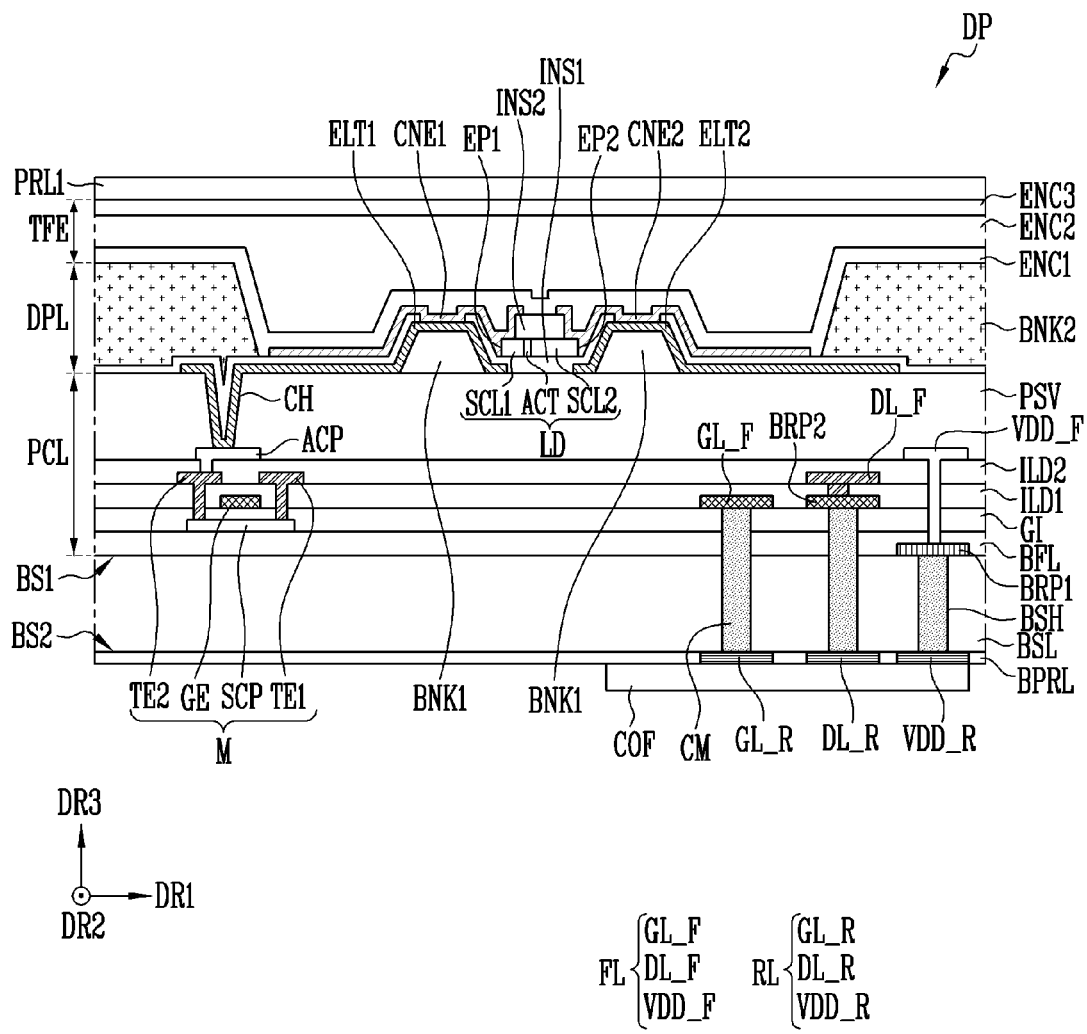
FIG. 6 is a cross-sectional view illustrating a portion of the display panel according to another embodiment.

FIG. 5 is a cross-sectional view illustrating a portion of the display panel according to an embodiment, FIG. 6 is a cross-sectional view illustrating a portion of the display panel according to another embodiment, and FIG. 7 is a cross-sectional view illustrating a portion of the display panel according to another embodiment.

Referring to FIG. 5, the display panel DP includes the pixel circuit layer PCL, the display element layer DPL, and the thin film encapsulation layer TFE sequentially disposed in the third direction DR3 on a first surface BS1 of the base layer BSL. However, a mutual position of (e.g., the relative positions of) the pixel circuit layer PCL, the display element layer DPL, and the thin film encapsulation layer TFE may vary according to an embodiment.

The base layer BSL includes a base hole BSH passing through the first surface BS1 and a second surface BS2, and a conductive material CM may be filled inside the base hole BSH. The base hole BSH may be provided in plurality, and the plurality of base holes BSH may be separate from each other. The conductive material CM filled in the base hole BSH may be in direct contact with a first line FL and a second line RL positioned on the first surface BS1 and the second surface BS2, respectively, to electrically and/or physically couple (e.g., connect) the first line FL and the second line RL positioned on the surface BS1 and the second surface BS2, respectively. For example, the base layer BSL may be formed of glass, quartz, glass ceramic, and/or the like.

The pixel circuit layer PCL includes the circuit element configuring the pixel circuit of each of the pixels (refer to PX of FIG. 4), the pixel circuit of the pixel PX, and the first line FL coupled (e.g., connected) to the light emitting element LD.

The circuit element may include a transistor M, a capacitor, and/or the like, and the first line FL may include a first gate line GL_F (also referred to as a "front gate line") that may be electrically coupled (e.g., connected) to the circuit element, a first data line DL_F (also referred to as a "front data line"), a first driving voltage line VDD_F (also referred to as a "front driving voltage line"), and/or the like. In addition, the first line FL may further include front sensing lines for detecting characteristic information of the pixel PX.

The first line FL may be lines positioned on the first surface BS1 of the base layer BSL, and may be electrically coupled (e.g., connected) to the second line RL positioned on the second surface BS2 of the base layer BSL. A first bridge pattern BRP1 positioned on the first surface BS1 may electrically couple (e.g., connect) a rear driving voltage line, which is to be described later, to the first driving voltage line VDD_F.

The second line RL may include a second gate line GL_R (also referred to as a "rear gate line"), a second data line DL_R (also referred to as a "rear data line"), and/or a second driving voltage line VDD_R (also referred to as a "rear driving voltage line"). In addition, the second line RL may further include rear sensing lines for detecting characteristic information of the pixel PX.

The second line RL may be formed to overlap at a position corresponding to the first line FL so as to be coupled (e.g., connected) to the first line FL. The second gate line GL_R may be electrically and/or physically coupled (e.g., connected) to the first gate line GL_F through the base hole BSH (e.g., a corresponding base hole BSH). The second data line DL_R may be electrically and/or physically coupled (e.g., connected) to the first data line DL_F, for example, through the base hole BSH (e.g., a corresponding base hole BSH). In some embodiments, the second data line DL_R may be electrically and/or physically coupled to the first data line DL_F through a corresponding base hole BSH and a second bridge pattern BRP2. The second driving voltage line VDD_R may be electrically and/or physically coupled (e.g., connected) to the first driving voltage line VDD_F through the base hole BSH (e.g., a corresponding base hole BSH) and the first bridge pattern BRP1. According to an embodiment, the second line RL may be integrally formed with the conductive material CM of the base hole BSH.

A lower protective layer BPRL is positioned on the second surface BS2 of the base layer BSL to cover the second line RL. In some embodiments, the lower protective layer BPRL may be a lower protective film. In some embodiments, the lower protective layer BPRL may cover a side surface of the second line RL and may be on at least a part of the lower surface of the second line RL. The lower protective layer BPRL may be an organic insulating film including (e.g., being) an organic material, but the disclosure is not limited thereto. According to an embodiment, the lower protective layer BPRL may be an inorganic insulating film including (e.g., being) an inorganic material. The lower protective layer BPRL may be entirely disposed on the second surface BS2 of the base layer BSL including the second line RL, and may expose a portion of the second line RL (e.g., all or a part, for example, a center part, of a lower surface of the second line RL) in a predetermined or set area (e.g., a set area of the lower protective layer BPRL corresponding to the second line RL). The portion exposed by the second line RL may contact a connection film COF to be described later.

The second line RL may be electrically coupled (e.g., connected) to the driving circuit (or driver) in a predetermined or set area through the connection film COF. A gate driver, a data driver, and a power driver may be mounted on the connection film COF positioned on a rear surface of the second line RL. Here, the connection film COF may be provided as a chip on film or a flexible printed circuit board (FPCB), but the disclosure is not limited thereto.

The second gate line GL_R may be electrically coupled (e.g., connected) to the gate driver through the connection film COF, the second data line DL_R may be electrically coupled (e.g., connected) to the data driver through the connection film COF, and the second driving voltage line VDD_R may also be electrically coupled (e.g., connected) to the power driver through the connection film COF.

In an embodiment, the gate driver, the data driver, and the power driver are mounted on one (or the same) connection film COF, but the disclosure is not limited thereto. According to an embodiment, the gate driver, the data driver, and the like may be mounted on different connection films COF separated from each other, and the rear gate line GL_R and the rear data line DL_R may be coupled (e.g., connected) to different connection films COF, respectively.

Additionally, the pixel circuit layer PCL may include other types (e.g., kinds) of signal lines and the like coupled (e.g., connected) to the pixels PX.

The pixel circuit layer PCL further includes a plurality of insulating layers. For example, the pixel circuit layer PCL further includes a buffer layer BFL, a gate insulating layer GI, a first interlayer insulating layer ILD1, a second interlayer insulating layer ILD2, and a passivation layer PSV sequentially disposed in the third direction DR3 on the first surface BS1 of the base layer BSL.

The first bridge pattern BRP1 is positioned between the base layer BSL and the buffer layer BFL. For example, the buffer layer BFL may cover the first bridge pattern BRP1 and may have an opening exposing a portion (e.g., a center portion) of an upper surface of the first bridge pattern BRP1. The first bridge pattern BRP1 may physically and/or electrically couple (e.g., connect) the first driving voltage line VDD_F and the second driving voltage line VDD_R.

A semiconductor layer is positioned on the buffer layer BFL. The semiconductor layer may include a first semiconductor layer SCP, and may include a semiconductor layer of (e.g., corresponding to) each transistor among a plurality of transistors. The first semiconductor layer SCP may include a channel region overlapping a first gate electrode GE, and a first source region and a first drain region disposed on both sides of the channel region. In addition, the first bridge pattern BRP1 may be positioned on the buffer layer BFL. In some embodiments, the first bridge pattern BRP1 may be above the buffer layer BFL, for example, between the buffer layer BFL and the gate insulating layer GI.

The gate insulating layer GI is positioned on the semiconductor layer. The gate insulating layer GI may include (e.g., be) an inorganic material including (e.g., being) silicon oxide ($SiO_x$), silicon nitride ($SiN_x$), silicon oxynitride ($SiO_xN_y$), and/or the like.

A gate conductor is positioned on the gate insulating layer GI. The gate conductor includes the first gate electrode GE. The first gate electrode GE may be positioned to overlap the channel region of the first semiconductor layer SCP. The gate conductor may include the gate electrode of (e.g., corresponding to) each transistor among the plurality of transistors, one electrode of the storage capacitor, the first gate line GL_F, the second bridge pattern BRP2, and/or the like.

The first interlayer insulating layer ILD1 is positioned on the gate conductor.

A first data conductor is positioned on the first interlayer insulating layer ILD1. The first data conductor includes a first electrode TE1 and a second electrode TE2 of a transistor M. The first electrode TE1 may be a source electrode coupled (e.g., connected) to the first source region of the first semiconductor layer SCP, and the second electrode TE2 may be a drain electrode coupled (e.g., connected) to the first drain region of the first semiconductor layer SCP. In some embodiments, the first electrode TE1 may be a drain electrode of the transistor M, and the second electrode TE2 may be a source electrode. The first data conductor may include the first electrode TE1 and the second electrode TE2 of (e.g., corresponding to) each transistor M among the plurality of transistors, and may include another electrode of the storage capacitor, the first data line DL_F, and/or the like.

The second interlayer insulating layer ILD2 is positioned on the first data conductor.

A second data conductor is positioned on the second interlayer insulating layer ILD2. The second data conductor includes an anode connection pattern ACP coupling (e.g., connecting) the pixel circuit layer PCL and the display element layer DPL. The second data conductor may further include the first driving voltage line VDD_F, a driving low voltage line, and/or the like. The anode connection pattern ACP may be coupled (e.g., connected) to a first electrode ELT1 of the light emitting element LD of each pixel PX (e.g., of each corresponding pixel PX) through a contact hole CH. For example, the light emitting element LD may be one or more organic light emitting diodes and/or one or more subminiature inorganic light emitting diodes (e.g., one or more micro-LEDs).

The passivation layer PSV is positioned on the second data conductor. The display element layer DPL is positioned on the pixel circuit layer PCL including the passivation layer PSV. The contact hole CH of the passivation layer PSV may couple (e.g., connect) the anode connection pattern ACP of the pixel circuit layer PCL and the first electrode ELT1 of the display element layer DPL.

The display element layer DPL includes the light emitting element LD of the pixels PX and electrodes coupled (e.g., connected) to the light emitting element LD. The light emitting element LD may be a subminiature inorganic light emitting diode as small as a nano scale to a micro scale formed of a structure in which a nitride-based semiconductor is grown. In an embodiment, each of the light emitting elements LD may be a pillar-shaped subminiature inorganic light emitting diode having an aspect ratio greater than 1, but is not limited thereto.

The display element layer DPL includes a first bank BNK1, a second bank BNK2, the first electrode ETL1, a second electrode ETL2, a first insulating layer INS1, a second insulating layer INS2, a first contact electrode CNE1, and/or a second contact electrode CNE2.

The first bank BNK1 is positioned on the passivation layer PSV. The first bank BNK1 may be positioned in an emission area from which light is emitted from each pixel PX. The first bank BNK1 may be disposed under a portion of the first electrode ELT1 and the second electrode ELT2 to guide the light emitted from the light emitting element LD in an image display direction (for example, an upper direction of each pixel PX) of the display device, and thus the first bank BNK1 may protrude the portion of the first electrode ELT1 and the second electrode ELT2 in an upper direction, for example, the third direction DR3. For example, the first electrode ELT1 and the second electrode ELT2 may cover the first bank BNK1, and thus, a portion of each of the first electrode ELT1 and the second electrode ELT2 that covers the first bank BNK1 may be protruded in the third direction DR3 compared to an adjacent portion of the first electrode ELT1 and the second electrode ELT2, respectively. The first bank BNK1 may include an inorganic insulating film formed of an inorganic material or an organic insulating film formed of an organic material. According to an embodiment, the first bank BNK1 may include an organic insulating film of a single film or an inorganic insulating film of a single film, but is not limited thereto.

The second bank BNK2 is positioned on the passivation layer PSV. In some embodiments, the second bank BNK2 may be positioned on the first insulating layer INS1. The second bank BNK2 is a structure for dividing (e.g., separating or spacing apart) the emission area of each of the pixels PX, and may be positioned in the non-emission area of each pixel PX and the non-emission area between the pixels PX to surround (e.g., partially or entirely surround) the emission area of each pixel PX. For example, the second bank BNK2 may be a pixel defining film or a dam structure. The second bank BNK2 may be configured to include (e.g., be) a light blocking material and/or a reflective material.

Each of the first electrode ELT1 and the second electrode ELT2 is positioned on the first bank BNK1 and has a surface corresponding to a shape of the first bank BNK1. The first electrode ELT1 and the second electrode ELT2 may include (e.g., be) a material having a uniform reflectance. Accordingly, the light emitted from the light emitting element LD by the first electrode ELT1 and the second electrode ELT2 may proceed in the image display direction of the display device.

The first electrode ELT1 may be electrically coupled (e.g., connected) to the second electrode TE2 of the transistor M through the contact hole CH passing through the passivation layer PSV. However, the present disclosure is not limited thereto. For example, in some embodiments, the first electrode ELT1 may be electrically coupled (e.g., connected) to the first electrode TE1 of the transistor M, for example, through a contact hole in the passivation layer PSV. The second electrode ELT2 may be coupled (e.g., connected) to a driving power through at least one contact hole passing through the passivation layer PSV in an area (e.g., a set area of the passivation layer PSV). In an embodiment, the first electrode ELT1 may be an anode, and the second electrode ELT2 may be a cathode. Each of the first electrode ELT1 and the second electrode ELT2 may be an ohmic contact electrode or a Schottky contact electrode, but the disclosure is not limited thereto.

In some embodiments, the first insulating layer INS1 may be positioned between each of the first electrode ELT1 and the second electrode ELT2 and the passivation layer PSV. In some embodiments, a portion of the first insulating layer INS1 may be between the first electrode ELT1 and the second electrode ELT2 along a horizontal direction, for example, the first direction DR1, and the portion of the first insulating layer INS1 that is between the first electrode ELT1 and the second electrode ELT2 may be above (e.g., directly above) the passivation layer PSV. The first insulating layer INS1 may stably support the light emitting element LD by filling a space between the light emitting element LD and the passivation layer PSV. For example, the first insulating layer INS1 may be between the passivation layer PSV and the light emitting element LD. The first insulating layer INS1 may include an inorganic insulating film and/or an organic insulating film, and may be configured of a single layer or multiple layers.

The light emitting element LD is positioned on the first insulating layer INS1. At least one light emitting element LD may be disposed between the first electrode ELT1 and the second electrode ELT2. For example, the light emitting element LD may be between the first electrode ELT1 and the second electrode ELT2 in a horizontal direction, for example, the first direction DR1. A plurality of light emitting elements LD may be disposed between the first electrode ELT1 and the second electrode ELT2, and the plurality of light emitting elements LD may be coupled (e.g., connected) to each other in parallel.

Each of the light emitting elements LD may emit light of any suitable one of a predetermined or set color and/or white light. In an embodiment, the light emitting elements LD may be arranged in a form capable of being sprayed into a solution and may be injected into each pixel PX.

The light emitting element LD includes a first semiconductor layer SCL1, an active layer ACT, and a second semiconductor layer SCL2 sequentially disposed in one direction (e.g., a horizontal direction, for example, the first direction DR1). The light emitting element LD may further include an insulating film surrounding an outer circumferential surface of the first semiconductor layer SCL1, the active layer ACT, and the second semiconductor layer SCL2.

The first semiconductor layer SCL1 may include a first conductivity type (e.g., kind) semiconductor. For example, the first semiconductor layer SCL1 may include at least one p-type semiconductor layer. For example, the first semiconductor layer SCL1 may include at least one semiconductor material selected from InAlGaN, GaN, AlGaN, InGaN, AlN, and InN, and may include a p-type semiconductor layer doped with a first conductivity type (e.g., kind) dopant (or p-type dopant) such as Mg.

The active layer ACT may be formed in a single quantum well structure or a multi-quantum well structure. According to an embodiment, a material such as AlGaN or AlInGaN may be utilized to configure the active layer ACT, and in addition to the above-described materials, the active layer ACT may be formed of various suitable materials. A position of the active layer ACT may be variously and suitably changed according to a type (e.g., kind) of the light emitting element LD. The active layer ACT may emit light having a wavelength of 400 nm to 900 nm, and may utilize a double hetero-structure. As used herein, the term nm may refer to a distance equal to $10^{-9}$ meters.

The second semiconductor layer SCL2 includes a semiconductor layer of a type (e.g., kind) different from that of the first semiconductor layer SCL1. For example, the second semiconductor layer SCL2 may include at least one n-type semiconductor layer. For example, the second semiconductor layer SCL2 may include (e.g., be) InAlGaN, GaN, AlGaN, InGaN, AlN, and/or InN, and may be an n-type semiconductor layer doped with a second conductivity type (e.g., kind) dopant (or n-type dopant) such as Si, Ge, and/or Sn.

One end in a direction of the first semiconductor layer SCL1 may be referred to as a first end EP1 of the light emitting element LD, and the other end in a direction of the second semiconductor layer SCL2 may be referred to as a second end EP2 of the light emitting element LD. For example, the first end EP1 may be at a side of the light emitting element LD along the first direction DR1 corresponding to the first semiconductor layer SCL1, and the second end EP2 may be at a side of the light emitting element LD along the first direction DR1 corresponding to the second semiconductor layer SCL2, and the second end EP2 may be facing oppositely away from the first end EP1.

The second insulating layer INS2 is positioned on a portion of the light emitting elements LD. The second insulating layer INS2 may cover a portion (e.g., a center portion) of an upper surface of each of the light emitting elements LD, and may expose the first end EP1 and the second end EP2 of each of the light emitting elements LD. For example, the second insulating layer INS2 may expose a portion of the upper surface of the light emitting element LD at (e.g., corresponding to) each of the first end EP1 and the second end EP2. The second insulating layer INS2 may stably fix the light emitting elements LD. When an empty space exists between the first insulating layer INS1 and the light emitting elements LD before the second insulating layer INS2 is formed, the empty space may be at least partially filled by the second insulating layer INS2.

The first contact electrode CNE1 electrically and/or physically coupling (e.g., connecting) the first electrode ELT1 and one end (for example, the first end EP1) of both of the ends (e.g., of the first and second ends EP1 and EP2) of each of the light emitting elements LD is positioned on the first electrode ELT1. The first contact electrode CNE1 may be positioned to overlap a portion of the first insulating layer INS1, the second insulating layer INS2, and the light emitting element LD. The first insulating layer INS1 may be removed or have an opening at a portion where the first electrode ELT1 and the first contact electrode CNE1 are coupled (e.g., connected), for example, a portion where the first electrode ELT1 and the first contact electrode CNE1 directly contact.

A second electrode CNE2 electrically and/or physically coupling (e.g., connecting) the second electrode ELT2 and one end (for example, the second end EP2) of both of the ends of each of the light emitting elements LD is positioned on the second electrode ELT2. The second contact electrode CNE2 may be positioned to overlap a portion of the first insulating layer INS1, the second insulating layer INS2, and the light emitting element LD. The first insulating layer INS1 may be removed or have an opening at a portion where the second electrode ELT2 and the second contact electrode CNE2 are coupled (e.g., connected), for example, a portion where the second electrode ELT2 and the second contact electrode CNE2 directly contact.

The first contact electrode CNE1 and the second contact electrode CNE2 may be configured of a transparent conductive material. Accordingly, light emitted from each of the light emitting elements LD and/or reflected by the first electrode ELT1 and the second electrode ELT2 may proceed in the image display direction of the display device.

The light conversion layer LCL is positioned on the display element layer DPL.

The light conversion layer LCL includes a color conversion layer CCL including a quantum dot QD and/or a color filter CF positioned on the display element layer DPL or on the color conversion layer CCL. In some embodiments, the light conversion layer LCL includes the color conversion layer CCL, a cover layer CVL, a first light blocking pattern LBP1, a planarization film PLL, the color filter CF, and a second light blocking pattern LBP2 sequentially disposed on the display element layer DPL.

In an embodiment, when the light conversion layer LCL is directly formed on the display element layer DPL, the display element layer DPL further includes a third insulating layer INS3. The third insulating layer INS3 may include at least one organic film and/or at least one inorganic film, and may be entirely positioned on a surface of the display element layer DPL. In some embodiments, the third insulating layer INS3 may entirely cover the display element layer DPL.

The color conversion layer CCL is disposed on the light emitting element LD and includes color conversion particles (for example, a quantum dot QD of a predetermined or set color) for converting light of a first color emitted from the light emitting element LD into light of a second color.

For example, when at least one pixel PX is set as a red (or green) pixel PX and a blue light emitting element LD is disposed as a light source of the pixel PX, a color conversion layer CCL including a red (or green) quantum dot QD for converting blue light into red (or green) light may be disposed on the pixel PX. In addition, a red (or green) color filter CF may be disposed on the color conversion layer CCL.

The cover layer CVL for protecting the color conversion layer CCL may be positioned on the first surface BS1 of the base layer BSL including the color conversion layer CCL. For example, the cover layer CVL may be positioned on an upper surface of the color conversion layer CCL. In addition, the first light blocking pattern LBP1 may be disposed on an area corresponding to an outer side of the color conversion layer CCL. For example, the first light blocking pattern LBP1 may be disposed on the cover layer CVL and may cover a part (e.g., sides or edges) of the color conversion layer CCL. FIG. 5 illustrates an embodiment in which the color conversion layer CCL is first formed and then the first light blocking pattern LBP1 is formed, but the disclosure is not limited thereto. For example, an order of formation of the color conversion layer CCL and the first light blocking pattern LBP1 may be changed according to a process method, performance of equipment, and/or the like applied to the formation of the color conversion layer CCL.

The planarization film PLL may be positioned on the cover layer CVL and the first light blocking pattern LBP1. The planarization film PLL may planarize an upper surfaces of the color conversion layer CCL and the first light blocking pattern LBP1, and may include (e.g., be) an organic material and/or an inorganic material.

The color filter CF may be disposed on (e.g., may overlap) the emission area from which light is emitted from each pixel PX. The color filter CF includes (e.g., is) a color filter material capable of selectively transmitting light of a color corresponding to the color of each pixel PX. The second light blocking pattern LBP2 may be disposed outside the color filter CF. For example, the second light blocking pattern LBP2 may be disposed on the planarization film PLL and may cover a part (e.g., sides or edges) of the color filter CF.

The thin film encapsulation layer TFE is positioned on the light conversion layer LCL.

The thin film encapsulation layer TFE may be formed of a single layer or multiple layers. In an embodiment, the thin film encapsulation layer TFE may include a plurality of insulating films covering the display element layer DPL. For example, the thin film encapsulation layer TFE may include an inorganic film of at least one film and an organic film of at least one film.

For example, the thin film encapsulation layer TFE may have a structure in which an inorganic film and an organic film are alternately stacked. In an embodiment, the thin film encapsulation layer TFE may include a first encapsulation layer ENC1, a second encapsulation layer ENC2, and a third encapsulation layer ENC3. The first encapsulation layer ENC1 may be disposed on the display element layer DPL and may be positioned over at least a portion of the display area DA of FIG. 1 and the non-display area NA of FIG. 1. The second encapsulation layer ENC2 may be disposed on the first encapsulation layer ENC1 and may be positioned over at least a portion of the display area DA and the non-display area NA. The third encapsulation layer ENC3 may be disposed on the second encapsulation layer ENC2 and may be disposed over at least a portion of the display area DA and the non-display area NA. In an embodiment, the first encapsulation layer ENC1, the second encapsulation layer ENC2, and the third encapsulation layer ENC3 may be formed of an inorganic film including (e.g., being) an inorganic material. In some embodiments, the second encapsulation layer ENC2 may be formed of an organic film including (e.g., being) an organic material. In some embodiments, the first encapsulation layer ENC1 and the third encapsulation layer ENC3 may each be formed of an inorganic film including (e.g., being) an inorganic material, and the second encapsulation layer ENC2 may be formed of an organic film including (e.g., being) an organic material.

A first protective layer PRL1 is positioned on the thin film encapsulation layer TFE. The first protective layer PRL1 may include (e.g., may be formed of) a transparent insulating material. For example, the first protective layer PRL1 may include (e.g., be) molybdenum oxide ($MoO_3$), silicon oxide ($SiO_x$), and/or the like. Accordingly, because the first protective layer PRL1 may transmit the light emitted from the light emitting element LD, the first protective layer PRL1 may not affect (e.g., substantially affect) a transmittance of the display panel DP. In an embodiment, the first protective layer PRL1 may be formed at a thickness of 1500 Å or less, but is not limited thereto. As used herein, the term Å may refer to a distance equal to $10^{-10}$ meters.

The first protective layer PRL1 is a buffer (e.g., buffer layer), and the first protective layer PRL1 may prevent or reduce impurity penetration, serve as a buffer against external impact, and/or the like. Accordingly, the display panel DP may be protected from static electricity, a scratch, and/or the like introduced from the outside by positioning the first protective layer PRL1 including (e.g., being) a transparent insulating material on the thin film encapsulation layer TFE of the display panel DP.

Referring to FIG. 6, the thin film encapsulation layer TFE is directly positioned on the display element layer DPL of the display panel DP according to another embodiment. The display panel DP of FIG. 6 does not include the light conversion layer LCL, but the display panel DP may be protected from static electricity, a scratch, and/or the like introduced from the outside by the first protective layer PRL1 positioned on the thin film encapsulation layer TFE. In addition, because the first protective layer PRL1 may include (e.g., be) a material having high transmittance, the first protective layer PRL1 may not affect (e.g., substantially affect) the transmittance of the display panel DP.

Referring to FIG. 7, the display panel DP according to another embodiment includes an organic light emitting diode as the light emitting element LD. Because the base layer BSL, the pixel circuit layer PCL, and the thin film encapsulation layer TFE are the same (e.g., have the same composition and/or structure) as described above, the display element layer DPL is mainly described below.

The display element layer DPL includes an organic light emitting diode including a first electrode AE, an emission layer EML, and a second electrode CE as the light emitting element LD.

One of the first electrode AE or the second electrode CE may be an anode, and the other one of the first electrode AE or the second electrode CE may be a cathode. When the light emitting element LD is a front surface emission type (e.g., kind) organic light emitting diode, the first electrode AE may be a reflective electrode, and the second electrode CE may be a transmissive electrode. In an embodiment of the disclosure, a case where the light emitting element LD is the front surface emission type (e.g., kind) organic light emitting diode and the first electrode AE is the anode is described as an example.

The first electrode AE is coupled (e.g., connected) to the second electrode TE2 of the transistor M of the pixel circuit layer PCL through the contact hole CH passing through the passivation layer PSV and the anode connection pattern ACP. For example, the first electrode AE is coupled (e.g., connected) to the anode connection pattern ACP through the contact hole CH, and the anode connection pattern ACP couples (e.g., connects) the first electrode AE to the second electrode TE2. The first electrode AE may include a reflective film capable of reflecting light and/or a transparent conductive film disposed on or under the reflective film. For example, the first electrode AE may be configured of conductive films of multiple layers including a lower transparent conductive film and an upper transparent conductive film each formed of indium tin oxide (ITO), and of a reflective film provided between the lower transparent conductive film and the upper transparent conductive film and formed of silver (Ag).

The display element layer DPL may further include a pixel defining film PDL having an opening exposing a portion of the first electrode AE, for example, an upper surface of the first electrode AE. For example, the pixel defining film PDL may be on the pixel circuit layer PCL and may cover one part (e.g., sides or edges) of the first electrode AE and may expose another part (e.g., a center part) of the first electrode AE. Here, the pixel defining film PDL may be a configuration corresponding to the second bank BNK2 of the display panel DP described with reference to FIG. 5. The pixel defining film PDL and the second bank BNK2 may be substantially similar or identical. For example, the pixel defining film PDL may have the same composition, structure, and/or configuration as the second bank BNK2. The pixel defining film PDL may be an organic insulating film including (e.g., being) an organic material. For example, the pixel defining film PDL may be formed of an organic insulating film such as acryl resin, epoxy resin, phenolic resin, polyamide resin, and/or polyimide resin.

The emission layer EML may be disposed in an area corresponding to the opening of the pixel defining film PDL. In some embodiments, the emission layer EML may be disposed on one surface of the exposed first electrode AE. The emission layer EML may have a thin film structure of multiple layers including a light generation layer. The emission layer EML may include a hole injection layer that injects a hole, a hole transport layer having desired or excellent hole transport properties and for increasing a chance of recombination of a hole and an electron by suppressing a movement of an electron that is not combined in the light generation layer, the light generation layer that emits light by the recombination of the injected hole and an injected electron, a hole blocking layer for suppressing a movement of a hole that is not combined in the light generation layer, an electron transport layer for smoothly transporting the electron to the light generation layer, and an electron injection layer for injecting the electron.

The light generation layer may be formed individually in the emission area of each pixel PX, and the hole injection layer, the hole transport layer, the hole blocking layer, the electron transport layer, and the electron injection layer may be a common film coupled (e.g., connected) in emission areas adjacent to each other. However, in FIG. 7, the emission layer EML is shown based on the light generation layer.

The second electrode CE is positioned on the emission layer EML. The second electrode CE may be a common film commonly provided to the pixels PX, but is not limited thereto. The second electrode CE may be a transmissive electrode and may include (e.g., be) a transparent conductive substance (or material). The transparent conductive substance (or material) may include (e.g., be) a transparent conductive oxide such as indium tin oxide (ITO), indium zinc oxide (IZO), zinc oxide (ZnO), and/or indium tin zinc oxide (ITZO), and/or a conductive polymer such as PEDOT, but is not limited thereto.

The display panel DP of FIG. 7 may protect the display panel DP from static electricity, a scratch, and/or the like introduced from the outside by the first protective layer PRL1 positioned on the thin film encapsulation layer TFE.

In addition, because the first protective layer PRL1 may include (e.g., be) a material having high transmittance, the first protective layer PRL1 may not affect (e.g., substantially affect) the transmittance of the display panel DP.

Hereinafter, a method of manufacturing a display device according to an embodiment is described with reference to FIGS. 8A to 8F.

FIGS. 8A to 8F are cross-sectional views illustrating a method of manufacturing a display device according to an embodiment.

Figure 8A:
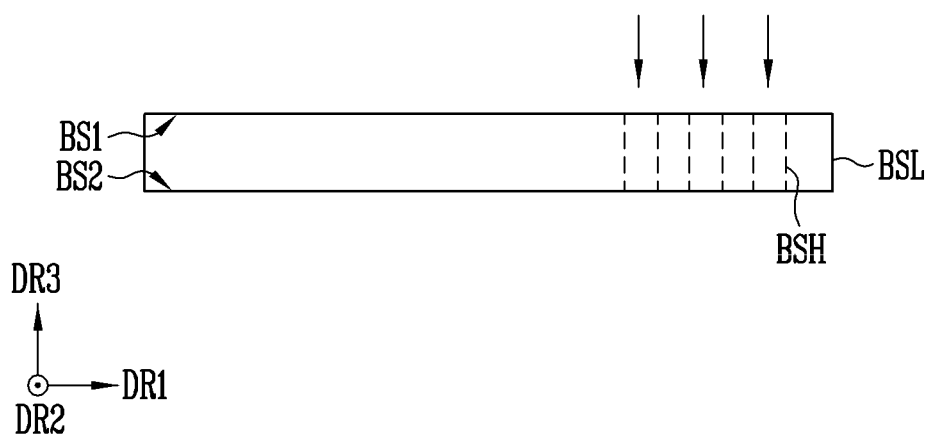

First, referring to FIG. 8A, the base layer BSL in which areas of the base hole BSH is defined is prepared, and the base layer BSL is processed by irradiating a laser to the areas of the base hole BSH (e.g., to areas where the base hole BSH is to be formed).

In an embodiment, the base layer BSL may be a glass substrate formed of glass, but is not limited thereto. According to an embodiment, the base layer BSL may be a film substrate including (e.g., being) a polymer organic material. When the laser is irradiated to the areas of the base hole BSH, at least a portion of the base layer BSL may be removed in the area of the base hole BSH and/or physical properties of the base hole BSH may be changed.

Figure 8B:
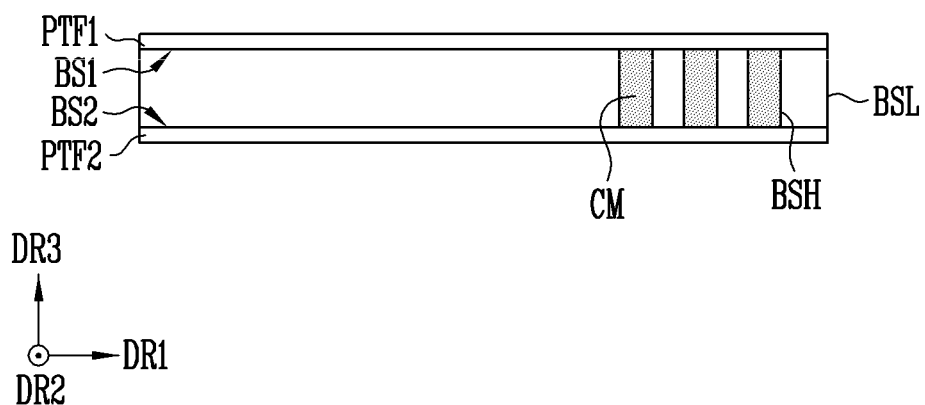

Referring to FIG. 8B, the conductive material CM is filled into the base hole BSH of the base layer BSL that is processed with the laser.

In an embodiment, the conductive material CM may be filled in the base hole BSH by a metal inkjet method and/or the like, but is not limited thereto. The conductive material CM may physically and/or electrically couple (e.g., connect) each of the first line FL and the second line RL to be described later. Accordingly, the conductive material CM filled in the base hole BSH may be a connection portion of the first line FL and the second line RL.

Thereafter, a protective film is coupled (e.g., attached) on each of the first surface BS1 and the second surface BS2 of the base layer BSL. The protective film coupled (e.g., attached) on the first surface BS1 of the base layer BSL may be referred to as a first surface protective film PTF1, and the protective film coupled (e.g., attached) on the second surface BS2 of the base layer BSL may be referred to as a second surface protective film PTF2. In an embodiment, because the first surface BS1 may be defined as an upper surface of the base layer BSL and the second surface BS2 may be defined as a lower surface of the base layer BSL, the first surface protective film PTF1 may be referred to as an upper surface protective film and the second surface protective film PTF2 may be referred to as a lower surface protective film.

Figure 8C:
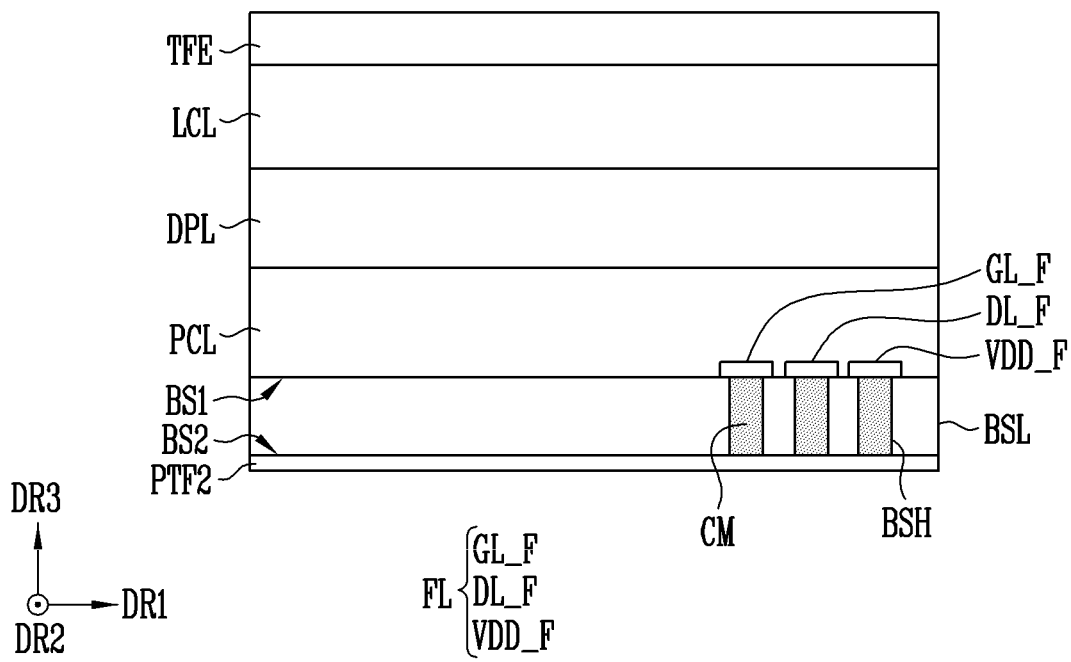

Referring to FIG. 8C, the first surface protective film PTF1 coupled (e.g., attached) on the first surface BS1 of the base layer BSL is removed, and the pixel circuit layer PCL, the display element layer DPL, the light conversion layer LCL, and the thin film encapsulation layer TFE are sequentially formed on the first surface BS1 of the base layer BSL.

The pixel circuit layer PCL may correspond to the pixel circuit layer PCL shown in FIGS. 5 to 7. The first gate line GL_F, the first data line DL_F, and the first driving voltage line VDD_F formed on the first surface BS1 of the base layer BSL shown in FIG. 8C may be referred to as the first line FL. In FIG. 8C, the first gate line GL_F, the first data line DL_F, and the first driving voltage line VDD_F are positioned on the same layer, but these are schematically shown, and as shown in FIGS. 5 to 7, the first gate line GL_F, the first data line DL_F, and the first driving voltage line VDD_F may be positioned on different layers. For example, the first interlayer insulating layer ILD1 may be positioned between the first gate line GL_F and the first data line DL_F, and the second interlayer insulating layer ILD2 may be positioned between the first data line DL_F and the first driving voltage line VDD_F. However, the present disclosure is not limited thereto. For example, in some embodiments, the gate insulating layer GI may be positioned between the first gate line GL_F and the first data line DL_F, and the first interlayer insulating layer ILD1 may be positioned between the first data line DL_F and the first driving voltage line VDD_F.

In addition, the display element layer DPL, the light conversion layer LCL, and the thin film encapsulation layer TFE may be the display element layer DPL, the light conversion layer LCL, and the thin film encapsulation layer TFE shown in FIGS. 5 to 7, respectively. For example, the display element layer DPL shown in FIGS. 8C to 8F may include one of an organic light emitting diode, an inorganic light emitting diode, and a subminiature light emitting diode as the light emitting element LD. According to an embodiment, when the light conversion layer LCL is not formed, the thin film encapsulation layer TFE may be directly formed on the display element layer DPL.

Figure 8D:
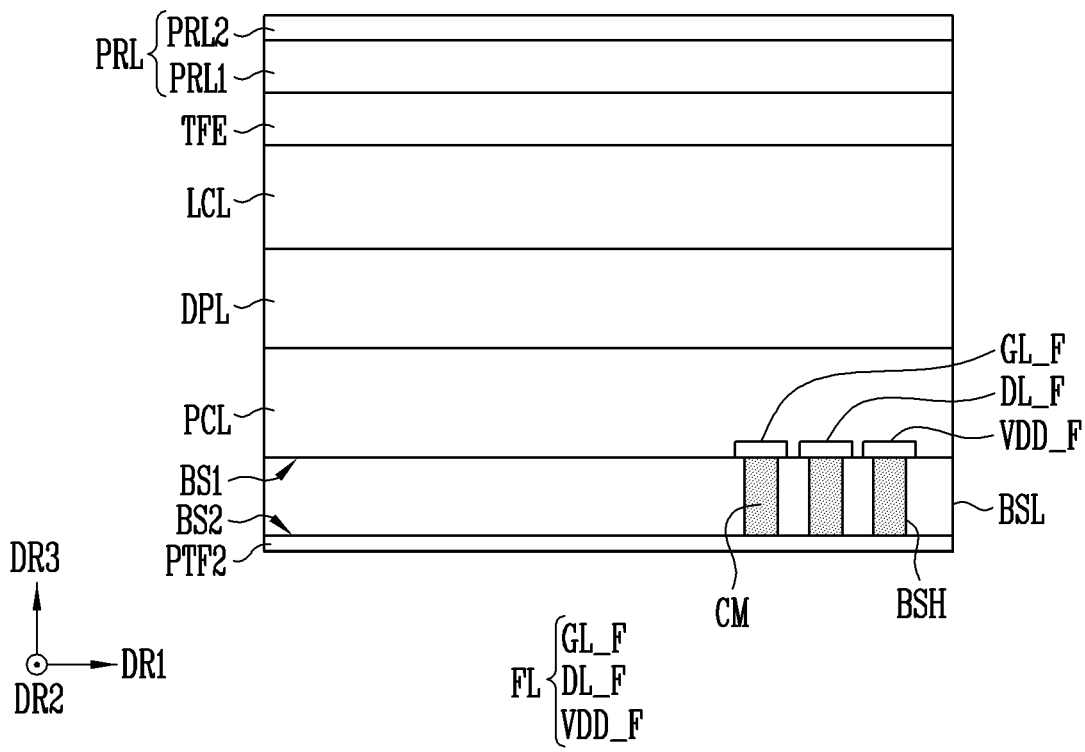

Referring to FIG. 8D, the protective layer PRL is formed on the thin film encapsulation layer TFE.

The protective layer PRL includes the first protective layer PRL1 directly formed on an upper surface of the thin film encapsulation layer TFE and a second protective layer PRL2 formed on the first protective layer PRL1.

The first protective layer PRL1 may prevent or reduce impurity penetration and serve as a buffer against an external impact as a buffer between the thin film encapsulation layer TFE and the second protective layer PRL2. The first protective layer PRL1 may include (e.g., be formed of) a transparent insulating material. For example, the first protective layer PRL1 may include (e.g., be) molybdenum oxide ($MoO_3$), silicon oxide ($SiO_x$), and/or the like. Accordingly, even though the first protective layer PRL1 is positioned on the thin film encapsulation layer TFE in a final structure of the display panel DP, light emitted from the display element layer DPL may be transmitted, and thus the first protective layer PRL1 may not affect (e.g., substantially affect) the transmittance of the display panel DP. In an embodiment, the first protective layer PRL1 may be formed at a thickness of 1500 Å or less, but is not limited thereto.

The second protective layer PRL2 may be positioned at the uppermost end of the display panel DP. For example, the second protective layer PRL2 may be a top layer of the display panel DP. When the thin film encapsulation layer TFE is positioned to face a lower surface, the second protective layer PRL2 may be positioned at the lowermost end of the display panel DP. The second protective layer PRL2 may include (e.g., may be formed of) a thin low-resistance conductive material. For example, the second protective layer PRL2 may include (e.g., be) aluminum (Al) having a resistance characteristic (e.g., electrical resistance) of less than $10^6 \Omega$ (Ohms). In addition, in an embodiment, the second protective layer PRL2 may be formed at (e.g., to have) a thickness of 30 Å to 100 Å, and may prevent, reduce, or block static electricity and/or the like that may occur at the lowermost end of the display panel DP.

Figure 8E:
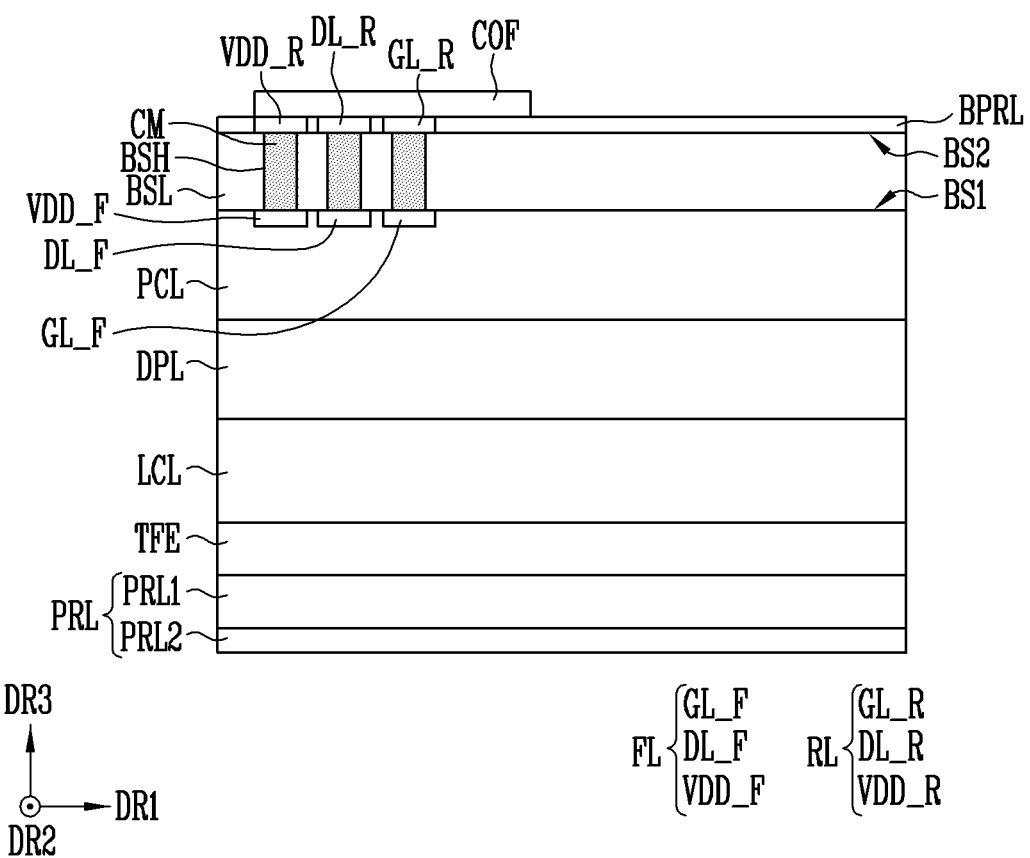

Referring to FIG. 8E, in order to form the second line RL on the second surface BS2 of the base layer BSL, the base layer BSL is positioned so that the first surface BS1 of the base layer BSL faces the lower surface and the second surface BS2 faces the upper surface by rotating (e.g., turning, flipping, etc.) the base layer BSL up and down (e.g., upside down). For example, the partially manufactured display panel may be turned upside down so that a direction from the protective layer PRL to the base layer BSL is in the third direction DR3. Accordingly, the thin film encapsulation layer TFE may be positioned to face the lower surface, and the first protective layer PRL1 and the second protective layer PRL2 may be positioned under the thin film encapsulation layer TFE. The thin film encapsulation layer TFE may not be directly exposed to the outside and may be protected by the protective layer PRL. For example, the first protective layer PRL1 may absorb an external impact, and the second protective layer PRL2 may prevent or reduce the occurrence of static electricity so that static electricity with the outside does not occur.

The second surface protective film PTF2 is removed from the second surface BS2 of the base layer BSL, and the second line RL is formed on the second surface BS2 of the base layer BSL. The second line RL may include the second gate line GL_R, the second data line DL_R, and the second driving voltage line VDD_R. On the cross-sectional view, the second line RL may be disposed to overlap the first line FL (e.g., along the third direction DR3) and may be electrically and/or physically coupled (e.g., connected) to the first line FL through the conductive material CM of the base hole BSH.

The second line RL is formed, and a lower protective layer BPRL is formed to cover the second surface BS2 of the base layer BSL and the second line RL. In addition, the lower protective layer BPRL is etched so that a portion of the second gate line GL_R, the second data line DL_R, and the second driving voltage line VDD_R is exposed.

Thereafter, the connection film COF may be coupled (e.g., attached) on the exposed portion of the second line RL. The gate driver, the data driver, the power driver, and/or the like may be mounted on the connection film COF, and the second gate line GL_R, the second data line DL_R, and the second driving voltage line VDD_R of the second line RL may be coupled (e.g., connected) to the gate driver, the data driver, and the power driver, respectively.

In a rear process of forming the second line RL and the lower protective layer BPRL on the second surface BS2 of the base layer BSL and coupling (e.g., attaching) the connection film COF, the display panel DP according to an embodiment may protect the thin film encapsulation layer TFE by the protective layer PRL.

Therefore, in a process of forming the second line RL on the second surface BS2 of the base layer BSL and forming the lower protective layer BPRL on the second line RL, the thin film encapsulation layer TFE of the display panel DP may be protected from external damage.

In a display device according to a comparative example, in order to protect a thin film encapsulation layer, an organic protective film may be coupled (e.g., attached) to an upper surface of the thin film encapsulation layer. On the other hand, the display device according to an embodiment of the present disclosure may form a molybdenum oxide ($MoO_3$), silicon oxide ($SiO_x$), aluminum (Al) film, or the like, which is cheaper in cost than an organic protective film, and thus, a cost for manufacturing the display device may be reduced.

Referring to FIG. 8F, the second line RL and the lower protective layer BPRL may be formed on the second surface BS2 of the base layer BSL, and the base layer BSL may be rotated (e.g., turned, flipped, etc.) up and down (e.g., upside down) again. For example, the partially manufactured display panel may be turned upside down again (e.g., a second time) so that a direction from the base layer BSL to the protective layer PRL is in the third direction DR3. Accordingly, the base layer BSL may be positioned so that the first surface BS1 of the base layer BSL faces the upper surface and the second surface BS2 faces the lower surface.

Thereafter, by a strip process, the second protective layer PRL2 may be etched by a stripper. Therefore, the second protective layer PRL2 is removed and does not remain in the display panel DP, and a portion of the first protective layer PRL1 remains.

Figure 9:
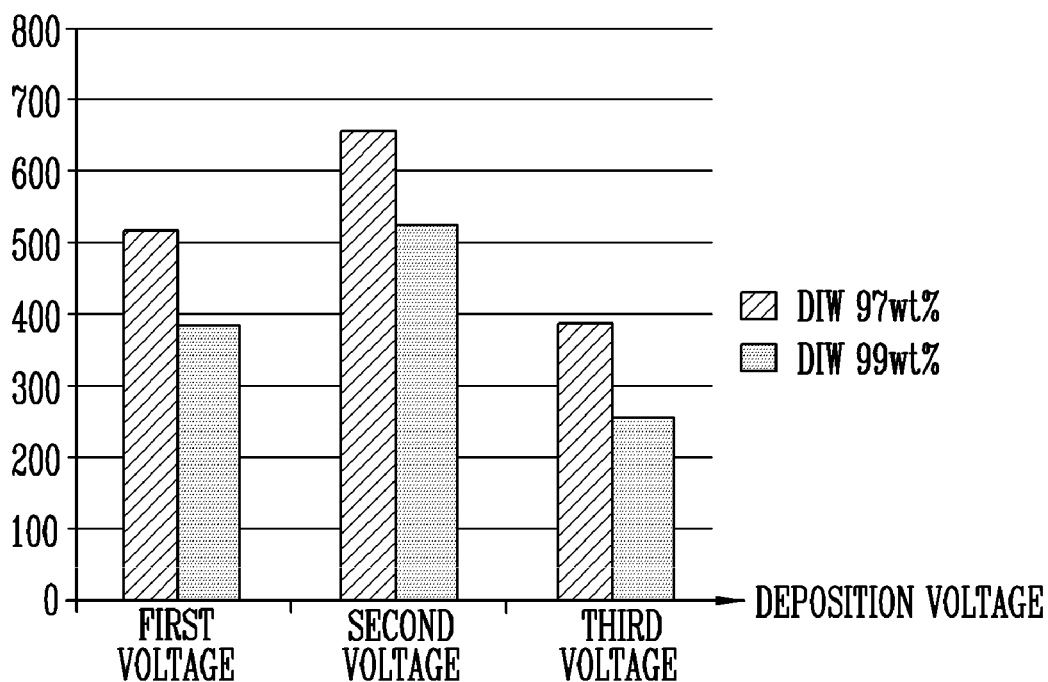
FIG. 9 shows an etching rate of a second protective layer according to a deposition voltage in an etching process of the display device according to an embodiment.

Referring to FIG. 9, as described with reference to FIG. 8F, a time of an etching process for removing the second protective layer may be known.

FIG. 9 shows an etching rate of the second protective layer according to a deposition voltage in the etching process of the display device according to an embodiment.

In an embodiment, the second protective layer PRL2 is formed of aluminum (Al), and FIG. 9 shows an experimental result when the second protective layer PRL2 is aluminum (Al). However, the etching rate may vary according to the material forming the second protective layer PRL2, and thus the etching rate is not limited thereto.

In addition, in an embodiment, when an alkaline etching solution (for example, deionized water (DIW)) is added and a deposition voltage is applied, the etching rate of the second protective layer PRL2 according to the deposition voltage and a concentration of the etching solution may be checked.

At a first voltage, a second voltage, and a third voltage, looking at the etching rate when the concentration of the etching solution (for example, DIW) is 97 wt % and 99 wt %, when the concentration of the etching solution is lower (e.g., is deionized), the etching rate may increase.

For example, when the concentration of the etching solution is 97 wt %, and the etching rate of the second protective layer PRL2 at the first voltage is greater than 500 Å/300 sec (1.66 Å/sec), even though a second voltage higher than the first voltage by about twice is applied, the etching rate of the second protective layer PRL2 may still be less than 700 Å/300 sec (2.33 Å/sec). In addition, when the third voltage higher than the second voltage by about twice is applied, the etching rate of the second protective layer PRL2 may be less than 400 Å/300 sec (1.33 Å/sec) or less (or less than 250 Å/300 sec (0.83 Å/sec) when the etching solution is 99 wt %). On average, the etching rate of the second protective layer PRL2 may be 500 Å/300 sec (1.66 Å/sec). Accordingly, when a thickness of the second protective layer PRL2 is 30 to 100 Å, the second protective layer PRL2 may be removed by performing an etching process for about 60 seconds. In the etching process for removing the second protective layer PRL2, because a stripper without damage to the display panel DP is utilized, the display panel DP may not be affected (e.g., substantially affected).

Hereinafter, a transmittance of the first protective layer may be checked in the display device according to the embodiment shown in FIGS. 5 to 7 with reference to FIG. 10.

Figure 10:
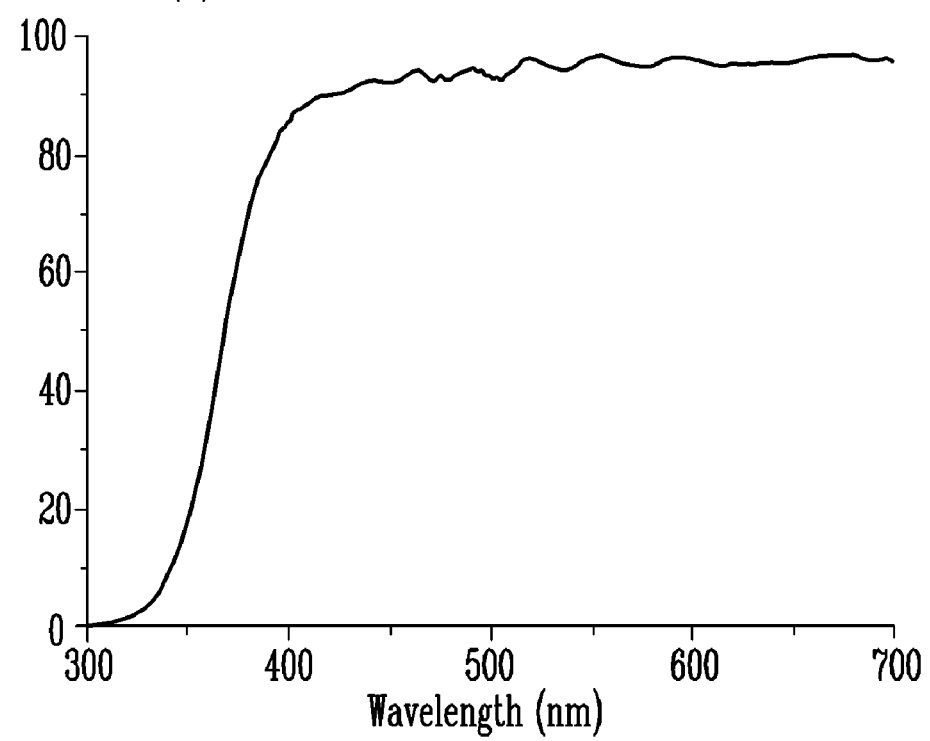
FIG. 10 shows a transmittance according to a wavelength of a first protective layer in the display device according to an embodiment.

FIG. 10 shows the transmittance, according to a wavelength, of the first protective layer in the display device according to an embodiment.

Referring to FIG. 10, when the wavelength is 400 nm or more, it may be known that the first protective layer PRL1 exhibits a transmittance of about 90% or more. Therefore, it may be checked that the transmittance is maintained high even though the first protective layer PRL1 is positioned on the thin film encapsulation layer TFE of the display panel DP in FIGS. 5 to 7 described above. The transmittance shown in FIG. 10 is an experimental example in a case where the first protective layer PRL1 is formed of molybdenum oxide ($MoO_3$). According to an embodiment, because the first protective layer PRL1 may include (e.g., be) a material having a high transmittance, the first protective layer PRL1 may not affect (e.g., substantially affect) the transmittance of the display panel DP.

Although the disclosure has been described with reference to the disclosed embodiment above, those of ordinary skill in the art and those having a common knowledge in the art will understand that the disclosure may be variously and suitably modified and changed without departing from the spirit and technical area of the disclosure described in the claims, which will be described later, and equivalents thereof.

Therefore, the technical scope of the disclosure should not be limited to the contents described in the detailed description of the specification, but should be defined by the claims and equivalents thereof.

What is claimed is:

1. A display device comprising:
   a display area and a non-display area around the display area;
   a base layer having a first surface and a second surface;
   a pixel circuit layer comprising a first line on the first surface;
   a display element layer on the pixel circuit layer and comprising a display element;
   a thin film encapsulation layer on the display element layer;
   a first protective layer on the thin film encapsulation layer; and
   a second line on the second surface to correspond to the first line,
   wherein the first protective layer comprises a transparent insulating material, and
   wherein the first and second lines are electrically coupled through a base hole passing through the base layer and positioned in the display area.

2. The display device according to claim 1, wherein the first protective layer comprises molybdenum oxide ($MoO_3$) or silicon oxide ($SiO_x$).

3. The display device according to claim 1, wherein the display element layer comprises a light emitting element, and
   the light emitting element comprises an organic light emitting diode or an inorganic light emitting diode.

4. The display device according to claim 3, further comprising:
   a light conversion layer between the display element layer and the thin film encapsulation layer.

5. The display device according to claim 4, wherein the light conversion layer comprises:
   a color conversion layer on the light emitting element and comprising color conversion particles to convert first color light emitted from the light emitting element into second color light; and
   a color filter on the display element layer or the color conversion layer.

6. The display device according to claim 1, wherein the pixel circuit layer comprises a plurality of insulating layers and at least one transistor, a transistor of the at least one transistor comprises:
a first semiconductor layer on the first surface of the base layer and comprising a channel region, a source region, and a drain region;
a gate electrode overlapping the channel region; and
a source electrode and a drain electrode respectively coupled to the source region and the drain region, and the plurality of insulating layers comprise:
a gate insulating layer between the first semiconductor layer and the gate electrode; and
a first interlayer insulating layer on the gate electrode.

7. The display device according to claim 6, wherein the first line comprises a first gate line and a first data line,
wherein the first gate line and the gate electrode are on the gate insulating layer, and
wherein the first data line and the source electrode and/or the drain electrode are on the first interlayer insulating layer.

8. The display device according to claim 7, wherein the second line comprises a second gate line electrically coupled to the first gate line through a first base hole passing through the base layer, and a second data line electrically coupled to the first data line through a second base hole passing through the base layer.

9. The display device according to claim 8, wherein each of the first base hole and the second base hole are filled with a conductive material, and the first line and the second line are physically and electrically coupled to each other through the conductive material.

10. The display device according to claim 9, further comprising:
a lower protective layer on the second line and entirely on the second surface, the lower protective layer exposing a portion of the second line in a set area.

11. The display device according to claim 10, further comprising:
a connection film contacting the portion of the second line exposed by the lower protective layer.

12. A method of manufacturing a display device, the method comprising:
preparing a base layer in which a base hole area is defined, and irradiating a laser to the base hole area to form a base hole;
filling a conductive material in the base hole irradiated with the laser;
attaching a first surface protective film to a first surface of the base layer, and attaching a second surface protective film to a second surface of the base layer;
removing the first surface protective film, and sequentially forming, on the first surface of the base layer, a circuit element layer comprising a first line, a display element layer, and a thin film encapsulation layer;
forming a first protective layer and a second protective layer on the thin film encapsulation layer;
rotating the base layer upside down and removing the second surface protective film, and forming a second line on the second surface of the base layer; and
rotating the base layer upside down and removing the second protective layer.

13. The method according to claim 12, wherein the first protective layer is formed of an insulating material comprising molybdenum oxide ($MoO_3$) or silicon oxide ($SiO_x$).

14. The method according to claim 12, wherein the second protective layer is formed of a conductive material comprising aluminum (Al).

15. The method according to claim 14, wherein the second protective layer is formed to be at a thickness of 30 Å to 100 Å.

16. The method according to claim 12, wherein the second line is disposed to overlap the first line and is formed to be physically and electrically coupled to the first line and the conductive material.

17. The method according to claim 16, further comprising:
forming a lower protective layer covering the second line; and
etching the lower protective layer so that a portion of the second line is exposed.

18. The method according to claim 17, further comprising:
attaching a connection film to the exposed portion of the second line.

19. The method according to claim 18, further comprising:
forming a light emitting element comprising an organic light emitting diode or an inorganic light emitting diode in the display element layer.

20. The method according to claim 19, further comprising:
forming a light conversion layer between the display element layer and the thin film encapsulation layer.

21. A display device comprising:
a base layer having a first surface and a second surface;
a pixel circuit layer comprising a first line on the first surface;
a display element layer on the pixel circuit layer and comprising a display element;
a thin film encapsulation layer on the display element layer;
a first protective layer on the thin film encapsulation layer; and
a second line on the second surface to correspond to the first line,
wherein the first protective layer comprises a transparent insulating material,
wherein the first line comprises a first gate line and a first data line, and
wherein the second line comprises a second gate line electrically coupled to the first gate line through a first base hole passing through the base layer, and a second data line electrically coupled to the first data line through a second base hole passing through the base layer.

* * * * *